US009806076B2

(12) United States Patent
Liu et al.

(10) Patent No.: US 9,806,076 B2
(45) Date of Patent: Oct. 31, 2017

(54) FINFET DEVICE AND METHOD OF MANUFACTURING SAME

(71) Applicant: Taiwan Semiconductor Manufacturing Company, Ltd., Hsin-Chu (TW)

(72) Inventors: Chi-Wen Liu, Hsinchu (TW); Chao-Hsiung Wang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/049,810

(22) Filed: Feb. 22, 2016

(65) Prior Publication Data

US 2016/0240531 A1    Aug. 18, 2016

Related U.S. Application Data

(60) Continuation of application No. 14/243,336, filed on Apr. 2, 2014, now Pat. No. 9,269,632, which is a division of application No. 13/252,892, filed on Oct. 4, 2011, now Pat. No. 8,723,272.

(51) Int. Cl.
| | |
|---|---|
| *H01L 27/088* | (2006.01) |
| *H01L 29/66* | (2006.01) |
| *H01L 29/78* | (2006.01) |
| *H01L 21/8238* | (2006.01) |
| *H01L 29/08* | (2006.01) |
| *H01L 29/51* | (2006.01) |

(52) U.S. Cl.
CPC .. *H01L 27/0886* (2013.01); *H01L 21/823821* (2013.01); *H01L 29/0847* (2013.01); *H01L 29/517* (2013.01); *H01L 29/518* (2013.01); *H01L 29/66795* (2013.01); *H01L 29/785* (2013.01); *H01L 29/7848* (2013.01)

(58) Field of Classification Search
CPC . H01L 29/0847; H01L 29/517; H01L 29/518; H01L 29/66795; H01L 29/7848; H01L 29/785; H01L 27/0886
See application file for complete search history.

(56) References Cited

U.S. PATENT DOCUMENTS

| | | | |
|---|---|---|---|
| 7,456,476 | B2 | 11/2008 | Hareland et al. |
| 2007/0001198 | A1 | 1/2007 | Lee |
| 2007/0037356 | A1 | 2/2007 | Wagner et al. |
| 2009/0095980 | A1 | 4/2009 | Yu et al. |
| 2009/0181477 | A1 | 7/2009 | King et al. |

*Primary Examiner* — Matthew Reames
(74) *Attorney, Agent, or Firm* — Haynes and Boone, LLP

(57) ABSTRACT

A semiconductor device and method for fabricating a semiconductor device is disclosed. An exemplary semiconductor device includes a substrate including a fin structure disposed over the substrate. The fin structure includes one or more fins. The semiconductor device further includes an insulation material disposed on the substrate. The semiconductor device further includes a gate structure disposed on a portion of the fin structure and on a portion of the insulation material. The gate structure traverses each fin of the fin structure. The semiconductor device further includes a source and drain feature formed from a material having a continuous and uninterrupted surface area. The source and drain feature includes a surface in a plane that is in direct contact with a surface in a parallel plane of the insulation material, each of the one or more fins of the fin structure, and the gate structure.

18 Claims, 9 Drawing Sheets

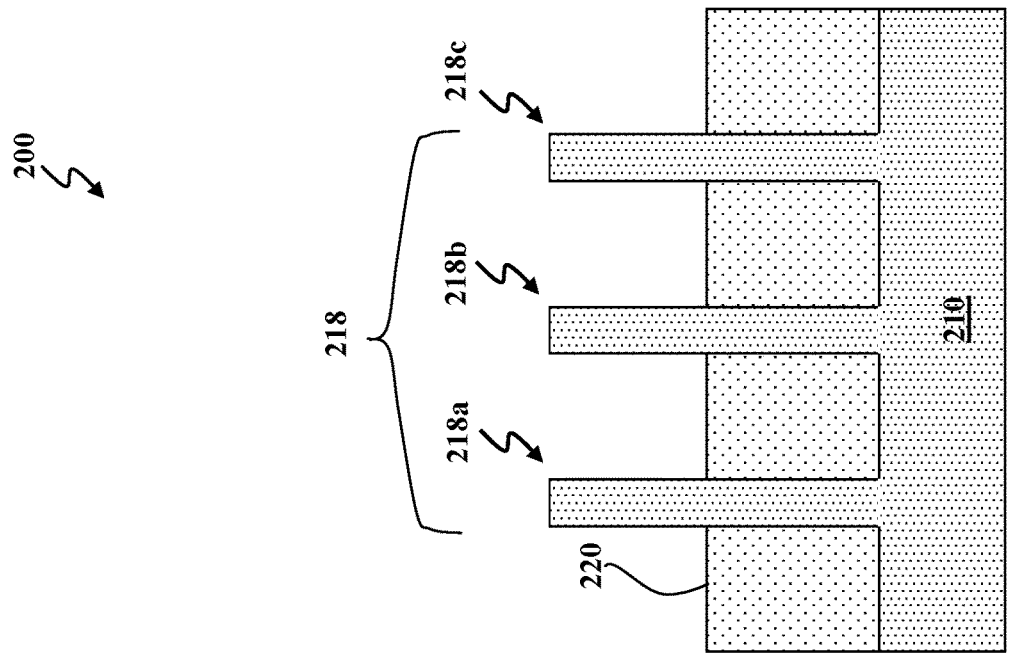
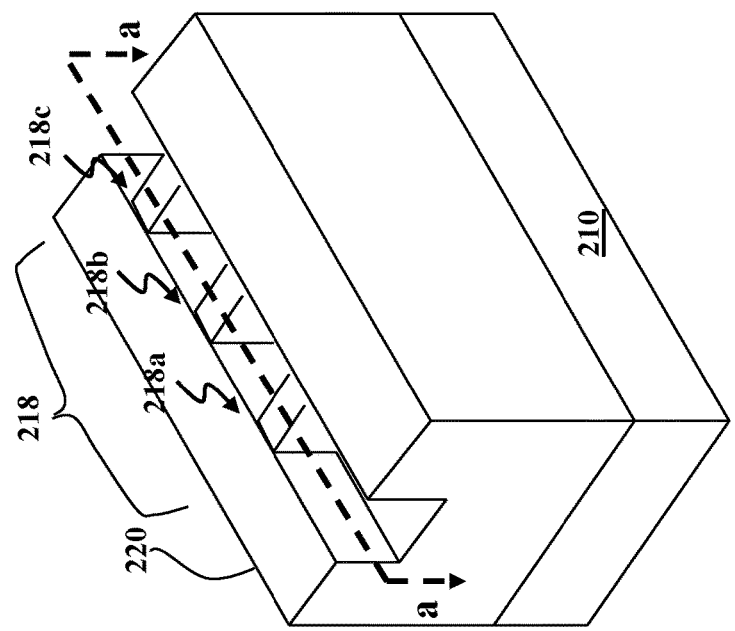
FIG. 6A
FIG. 6B

FINFET DEVICE AND METHOD OF MANUFACTURING SAME

CROSS REFERENCE

This application is a continuation of U.S. patent application Ser. No. 14/243,336 filed on Apr. 2, 2014, entitled "A FinFET Device and Method Of Manufacturing Same" which is a divisional of U.S. patent application Ser. No. 13/252,892 filed on Oct. 4, 2011, and issued as U.S. Pat. No. 8,723,272 on May 13, 2014, entitled "A FinFET Device and Method Of Manufacturing Same," the disclosures of which are incorporated herein by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of fin-like field effect transistor (FinFET) devices. Although existing FinFET devices and methods of fabricating FinFET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-9A illustrate perspective views of one embodiment of a semiconductor device at various stages of fabrication, according to the method of FIG. 1.

FIGS. 2B-9B illustrate diagrammatic cross-sectional side views of the semiconductor device, in portion or entirety, illustrated in FIGS. 2A-9A, respectively.

DETAILED DESCRIPTION

Figure 1:
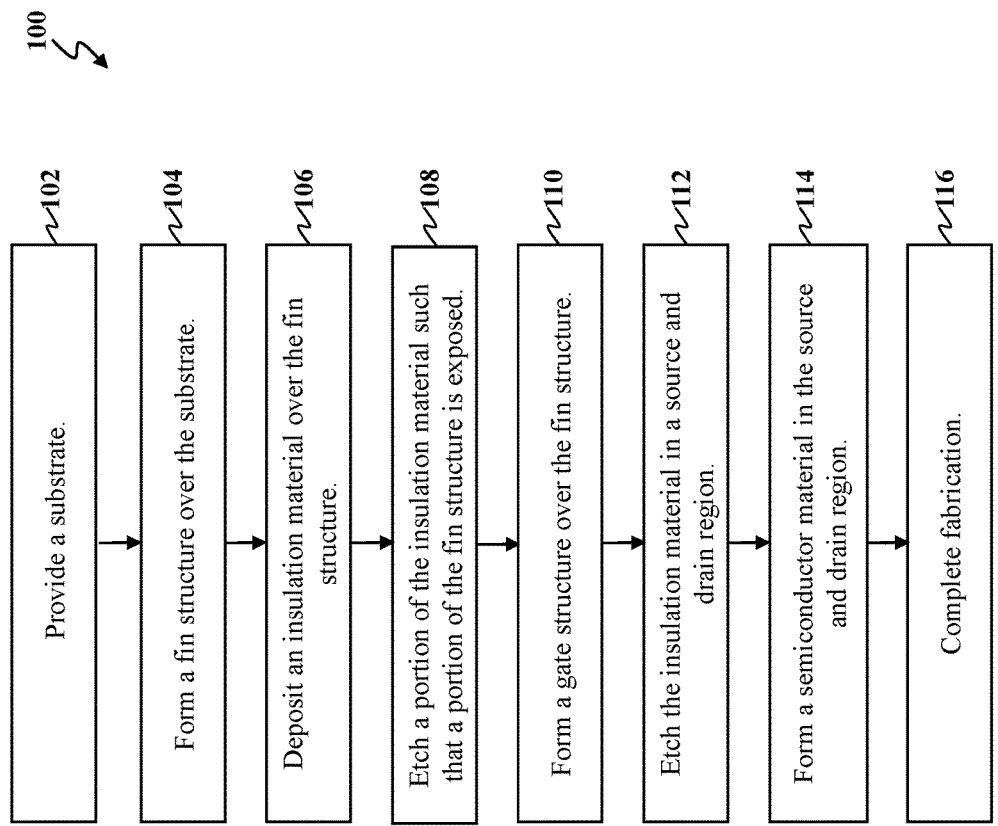
FIG. 1 is a flowchart illustrating a method of fabricating a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Examples of devices that can benefit from one or more embodiments of the present invention are semiconductor devices. Such a device, for example, is a fin-like field effect transistor (FinFET). The FinFET device, for example, may be a P-type metal-oxide-semiconductor (PMOS) FinFET device or a N-type metal-oxide-semiconductor (NMOS) FinFET device. The following disclosure will continue with a FinFET example to illustrate various embodiments of the present invention. It is understood, however, that the invention should not be limited to a particular type of device, except as specifically claimed.

Figures 2A, 2B:
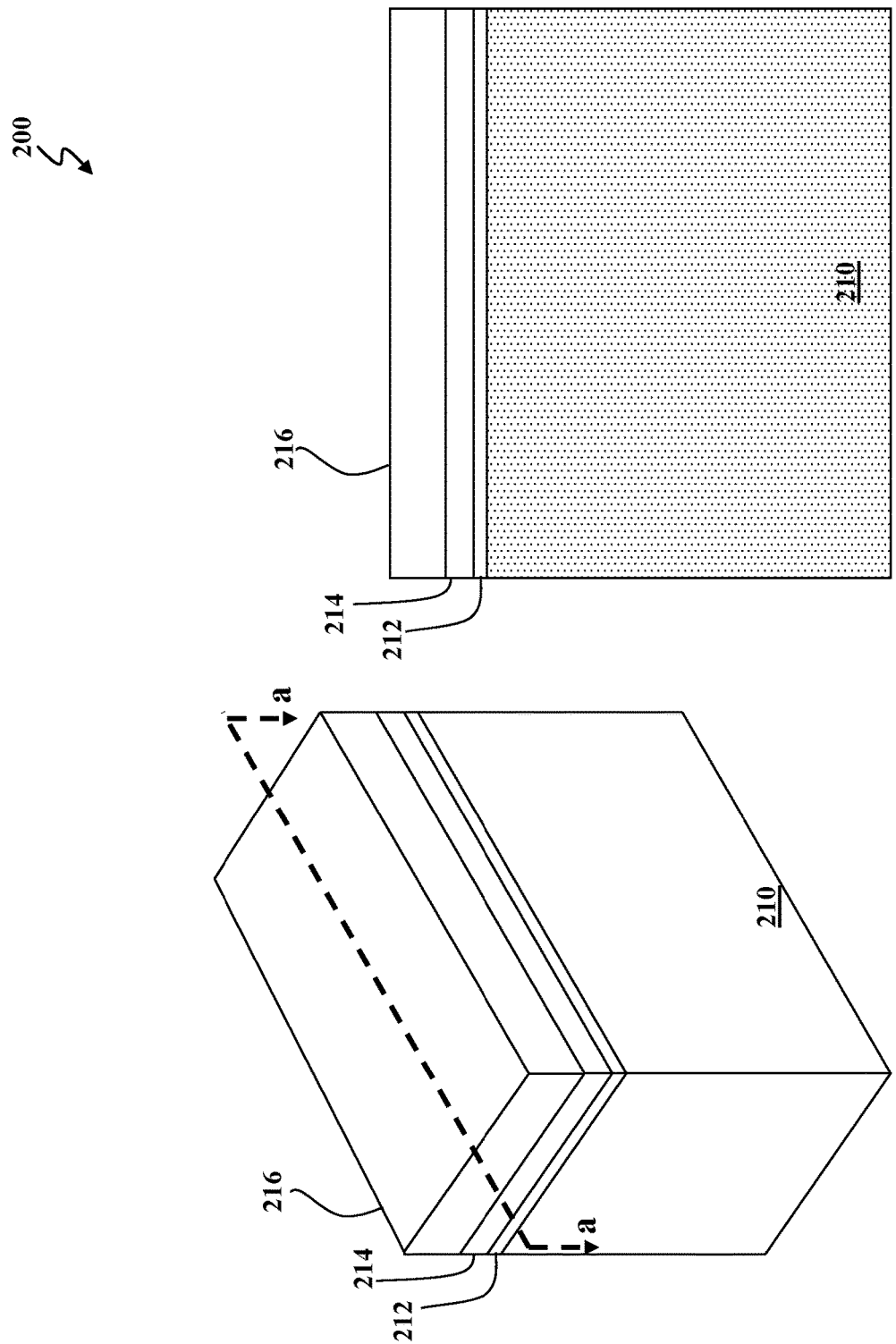

With reference to FIGS. 1 and 2A,B-9A,B, a method 100 and a semiconductor device 200 are collectively described below. FIG. 1 is a flow chart of a method 100 for fabricating an integrated circuit device according to various aspects of the present disclosure. In the present embodiment, the method 100 is for fabricating an integrated circuit device that includes a fin-like field effect transistor (FinFET) device. The method 100 begins at block 102 where a substrate is provided. At block 104, a fin structure is formed over the substrate. The formation of the fin structure may include patterning a mask layer and etching the semiconductor substrate using the mask layer. At block 106, a dielectric layer is deposited over the fin structure. The dielectric layer may be deposited such that it covers the fin structure. A planarizing process may be performed such that the top surface of the dielectric layer is planarized, exposing the top portion of the fin structure. The method continues with block 108 where an etching process is performed on the dielectric layer such that a portion of the sidewalls of the fin structure is exposed. The etching process may include depositing a photoresist layer on the dielectric layer in a source region and a drain region and performing an etching process in a central region of the FinFET device such that a portion of the sidewalls of the fin structure is exposed in the central region. At block 110, a gate stack is formed over a portion of the fin structure. Forming the gate stack may include depositing a dielectric layer over the fin structure in the central region, forming a gate structure over the dielectric layer, and forming gate spacers on the walls of the gate structure and adjacent to the source and drain (S/D) regions. The method 100 continues with block 112 where an etching process is performed on the dielectric layer in the S/D regions. The etching process may include depositing a photoresist layer on the dielectric layer and etching the dielectric layer such that a surface of the substrate is exposed. At block 114, a semiconductor material is formed in the S/D regions. The forming the semiconductor material may include epitaxially (epi) growing a strained semiconductor material over the exposed substrate in the S/D regions. The method 100 continues with block 116 where fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

FIGS. 2A-9A illustrate perspective views of one embodiment of a semiconductor device at various stages of fabrication, according to the method of FIG. 1. Additionally, FIGS. 2B-9B illustrate diagrammatic cross-sectional side views of the semiconductor device, in portion or entirety, illustrated in FIGS. 2A-9A, respectively, taken along line a-a. In the present disclosure, the semiconductor device is a FinFET device. The FinFET device includes any fin-based, multi-gate transistor. The FinFET device 200 may be included in a microprocessor, memory cell, and/or other integrated circuit device. FIGS. 2A,B-9A,B have been simplified for the sake of clarity to better understand the inventive concepts of the present disclosure. Additional features can be added in the FinFET device 200, and some of the features described below can be replaced or eliminated in other embodiments of the semiconductor device 200.

Referring to FIGS. 2A and B, the FinFET device 200 includes a substrate (e.g., wafer) 210. The substrate 210 is a bulk silicon substrate. Alternatively, the substrate 210 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

With further reference to FIGS. 2A and B, formed over the substrate 210 is a dielectric layer 212. The dielectric layer 212 is formed by any suitable process to any suitable thickness. In the present embodiment, the dielectric layer 212 includes silicon oxide and is formed by a CVD or a thermal oxidation process. The thermal oxidation process may be a dry or a wet process. In various examples, the silicon oxide can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Formed over the dielectric layer 212 is a mask layer 214. The mask layer 214 may be a stop/hard mask layer. The mask layer 214 is formed by any suitable process to any suitable thickness. The mask layer 214 may include a material such as silicon nitride, silicon oxide, silicon oxynitride, silicon carbide, silicon carbon nitride, amorphous silicon, poly silicon, other suitable material, or combinations thereof. In the present embodiment, the mask layer 214 includes silicon nitride and is formed by a CVD process. In various examples, the silicon nitride can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Formed over the mask layer 214 is a photoresist layer 216. The photoresist layer 216 is formed by any suitable process to any suitable thickness.

Figure 3B:
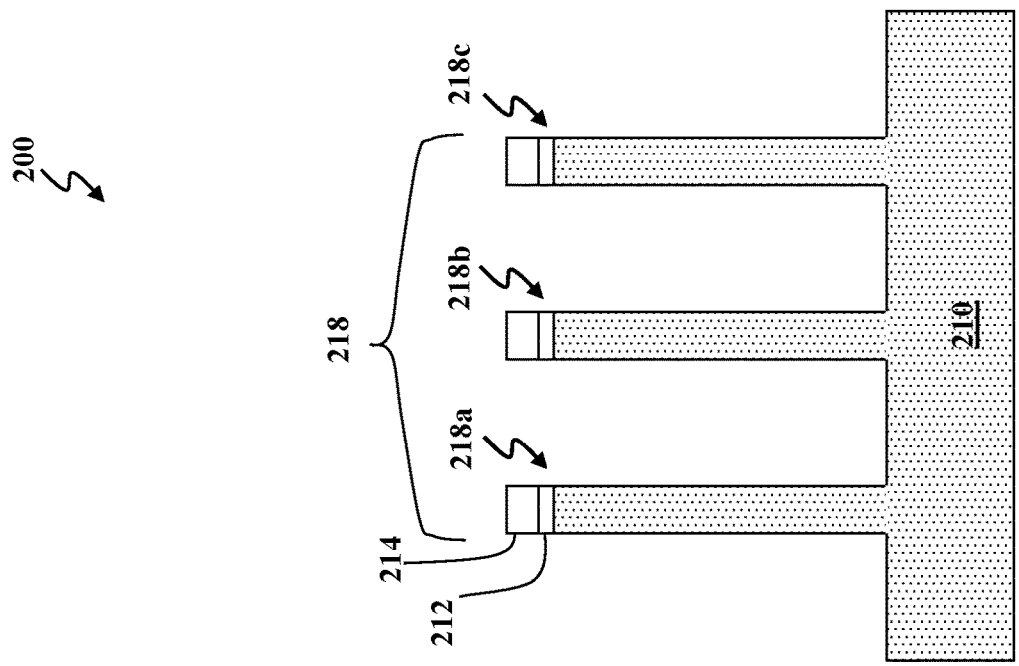
Figure 3A:
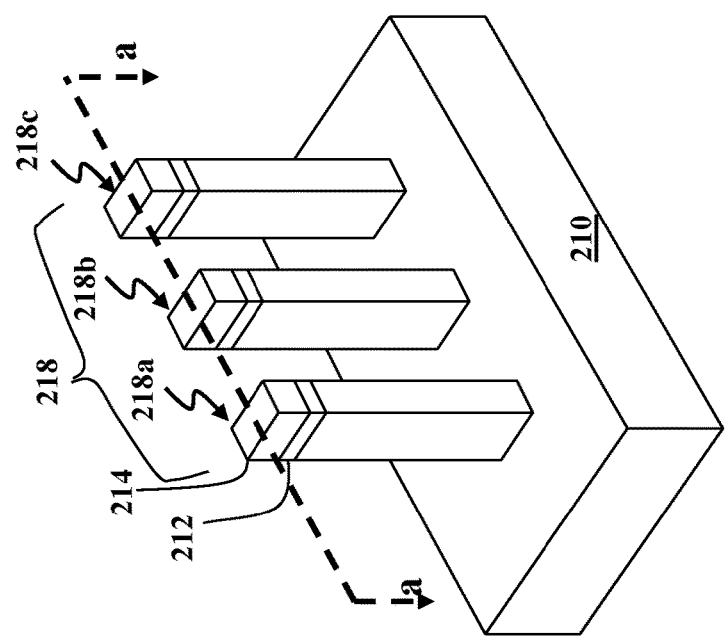

Referring to FIGS. 3A and B, fin structure 218 (including a plurality of fins 218a, 218b, and 218c) is formed by any suitable process, such as a photolithography and etching process. For example, in the present embodiment, the fin structure 218 is formed by exposing the photoresist layer 216 to a pattern, performing a post-exposure bake process, and developing the photoresist layer 216 to form a masking element including the photoresist layer 216 and the mask layer 214. The photoresist layer 216 patterning may include processing steps of photoresist coating, soft baking, mask aligning, exposing pattern, post-exposure baking, developing photoresist, and hard baking. The patterning may also be implemented or replaced by other proper methods, such as maskless photolithography, electron-beam writing, ion-beam writing, and molecular imprint. The masking element (including the photoresist layer 216 and the mask layer 214) may then be used in an etching process to etch the fin structure 218 into the substrate 210. The etching process uses the patterned mask layer 214 to define the area to be etched and to protect other regions of the FinFET device 200. The etching process may include a wet etching process, a dry etching process, or a combination thereof. The fin structure 218 may be formed by an etching process using a reactive ion etch (RIE) and/or other suitable process. In one example, a hydrofluoric acid (HF) or buffered HF may be used to etch the dielectric layer 212 to expose the substrate 210 according to the pattern defined by the mask layer 214. In one example, a dry etching process used to etch the substrate 210 includes a chemistry including fluorine containing gas. In furtherance of the example, the chemistry of the dry etch includes CF4, SF6, or NF3. Alternatively, the fin structure 218 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets).

Figure 4B:
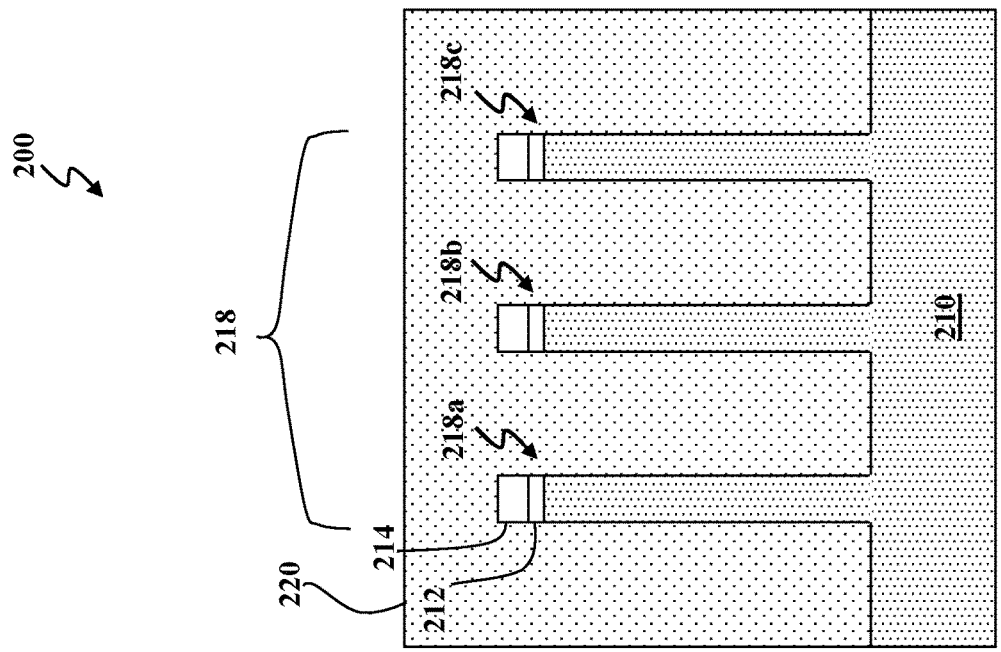
Figure 4A:
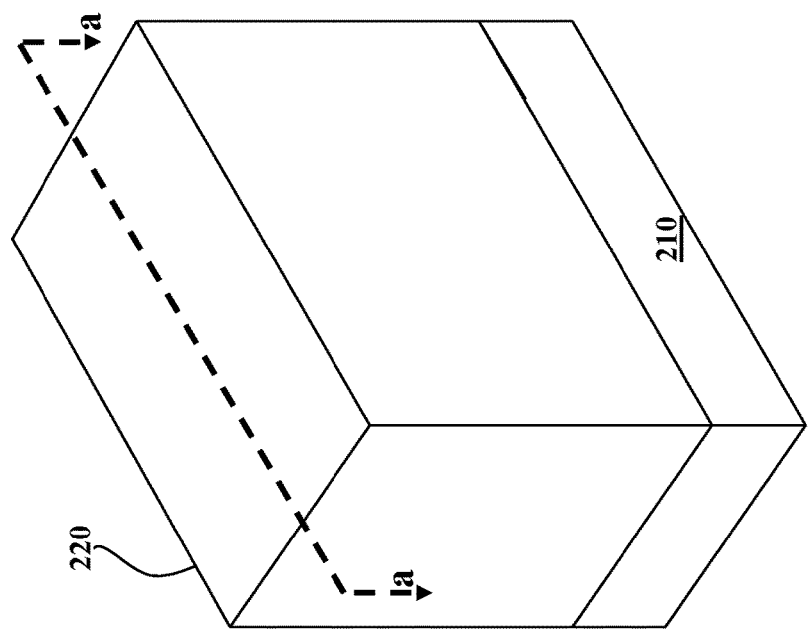

Referring to FIGS. 4A and B, deposited over the substrate 210 (and over the fin structure 218) is an insulation material 220. The insulation material 220 is deposited such that the insulation material 220 surrounds and isolates each fin 218a,b,c of the fin structure 218 from other fins. The insulation material 220 may include an insulating material such as silicon oxide, silicon nitride, silicon oxynitride, low k materials, air gap, other suitable material, or combinations thereof. In the present embodiment, the insulation material 220 includes silicon oxide. The silicon oxide can be deposited by a CVD process. In various examples, the silicon oxide can be formed by physical vapor deposition (PVD), atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner may be grown to improve the trench interface. The CVD process, for example, may use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6). The insulation material 220 may have a multi-layer structure, for example, a thermal oxide liner layer with silicon nitride formed over the liner.

Figure 5B:
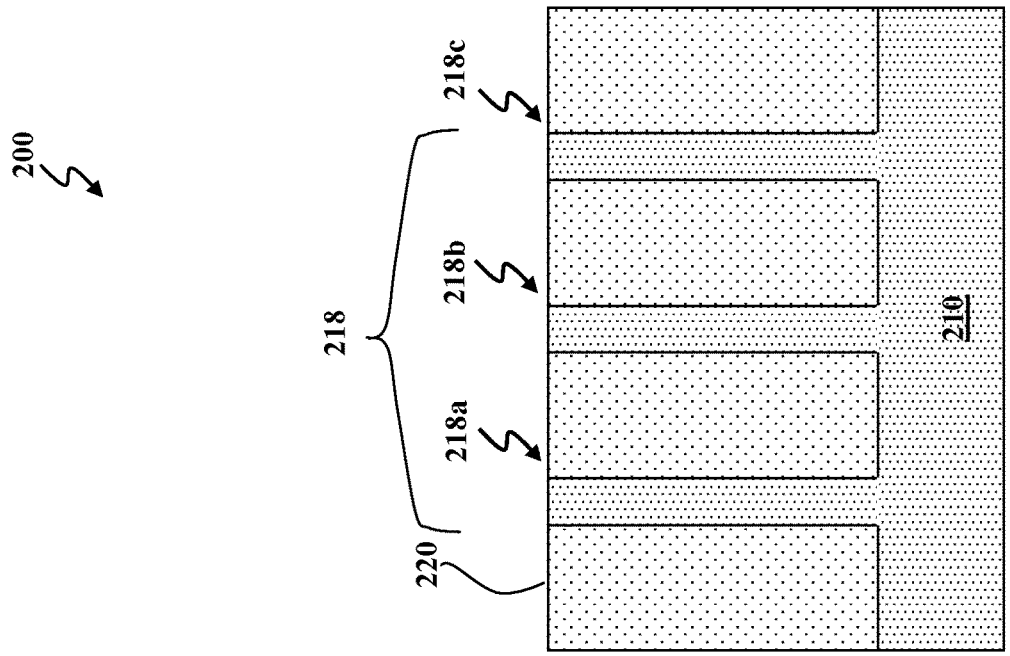
Figure 5A:
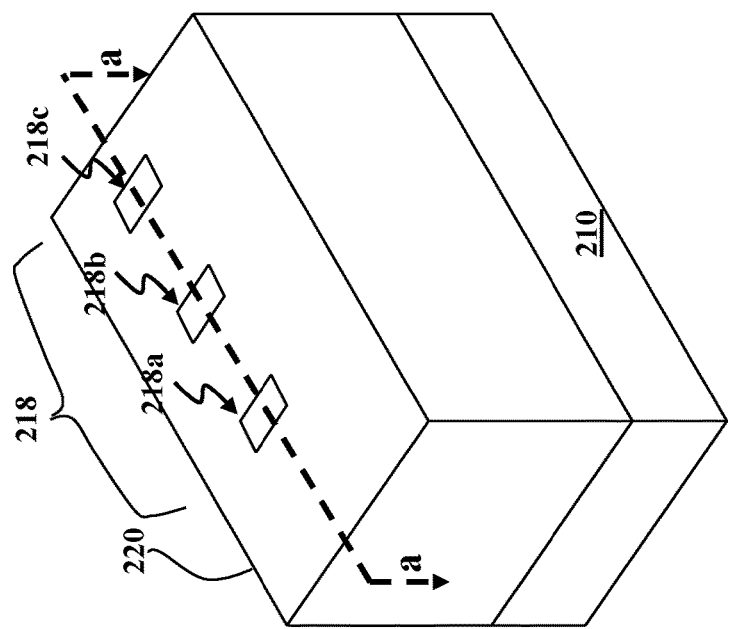

Referring to FIGS. 5A and B, a planarizing process is performed on the FinFET device 200. In one embodiment, the planarizing process includes a chemical mechanical polishing (CMP) process applied to the FinFET device 200 to remove excessive portions of the insulation material 220. The planarizing process may be performed such that the dielectric layer 212 is removed, thus exposing the fin structure 218.

Referring to FIGS. 6A and B, an etching process is used to etch-back excessive insulation material 220 in a central region of the FinFET device 200, thus exposing a portion of the sidewalls of the fin structure 218. The etching process may include a wet etching, a dry etching process, or a combination thereof. In one example, a dry etching process may include forming a photoresist layer, patterning the photoresist layer, etching the insulation material 220, and removing the photoresist layer. In furtherance of the example, the dry etching process used to etch the isolation material may include a chemistry including fluorine-containing gas. In furtherance of the example, the chemistry of the dry etch includes CF4, SF6, or NF3.

Figure 7B:
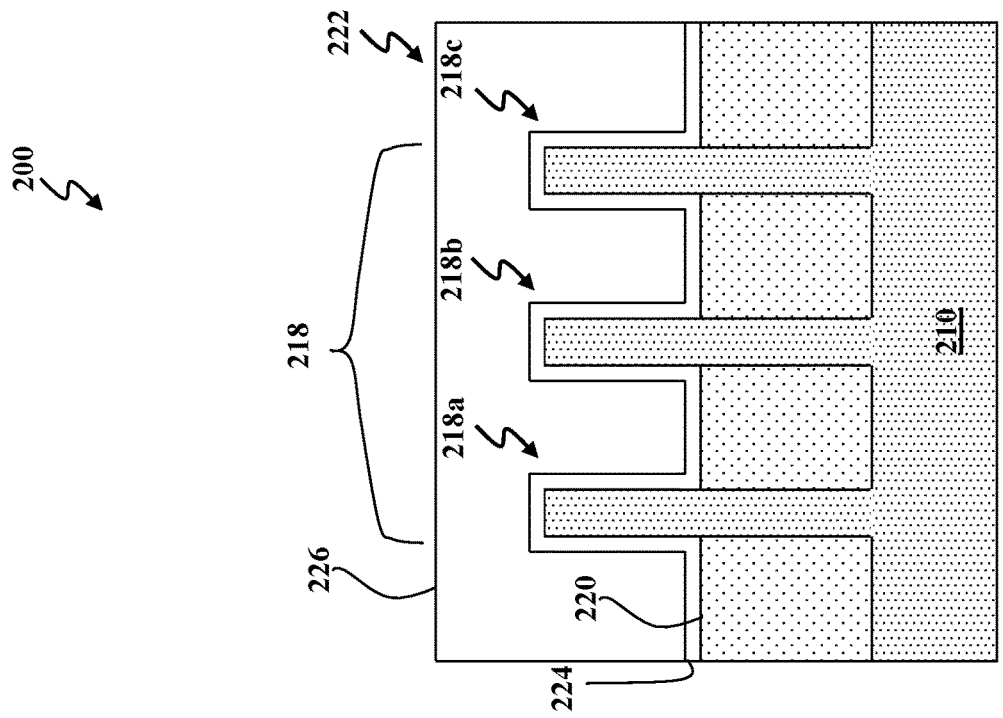
Figure 7A:
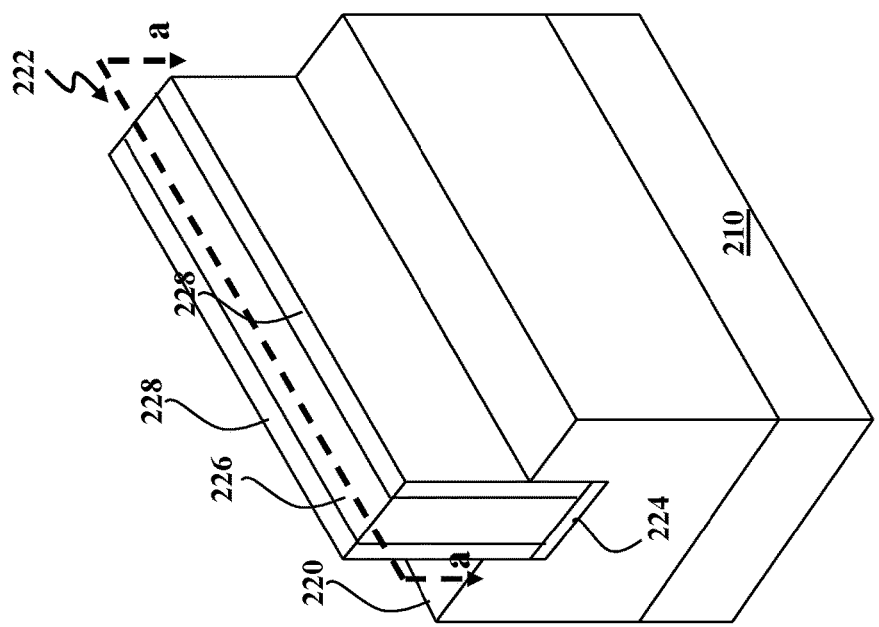

Referring to FIGS. 7A and B, the FinFET device 200 includes a gate structure 222. The gate structure 222 traverses the fin structure 218, and in the depicted embodiment, is formed on a central portion of the fin structure 218. The gate structure 222 may include a gate dielectric layer 224, a gate electrode 226, and gate spacers 228. The gate dielectric layer 224 includes a dielectric material, such as silicon oxide, high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. The gate electrode 226 includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate electrode 226 may be formed in a gate first or gate last process. The gate structure 222 may include numerous other layers, for example, capping layers, interface layers, diffusion layers, barrier layers, or combinations thereof. A hard mask layer may be formed over the gate structure 222. The hard mask layer may include silicon oxide, silicon nitride, silicon oxynitride, silicon carbide, other suitable material, or combinations thereof.

The gate structure 222 is formed by a suitable process, including deposition, lithography patterning, and etching processes. The deposition processes include chemical vapor deposition (CVD), physical vapor deposition (PVD), atomic layer deposition (ALD), high density plasma CVD (HDP-CVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

Figure 8B:
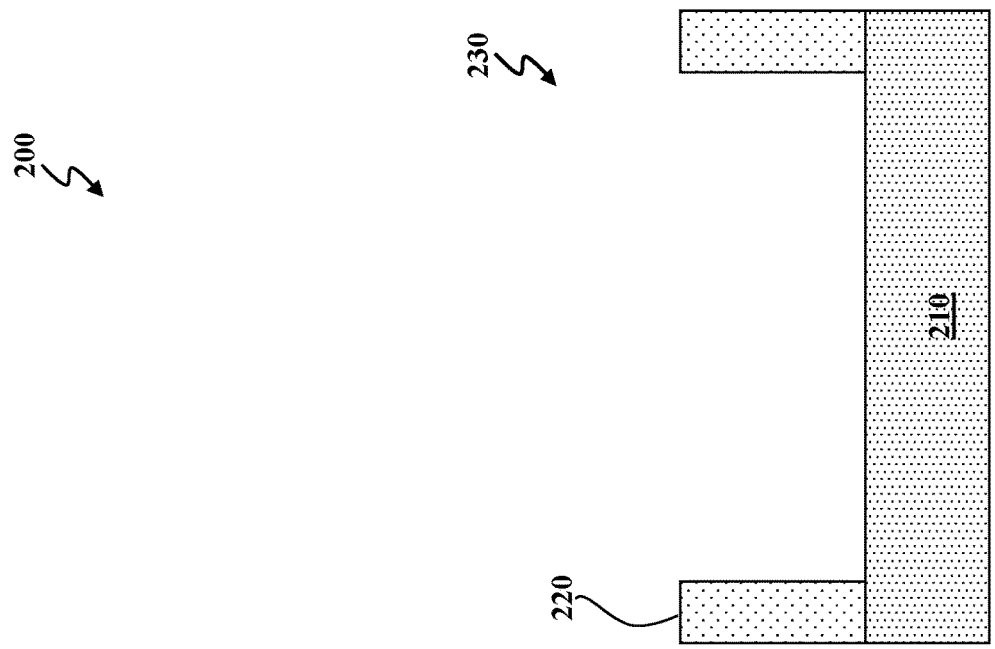
Figure 8A:
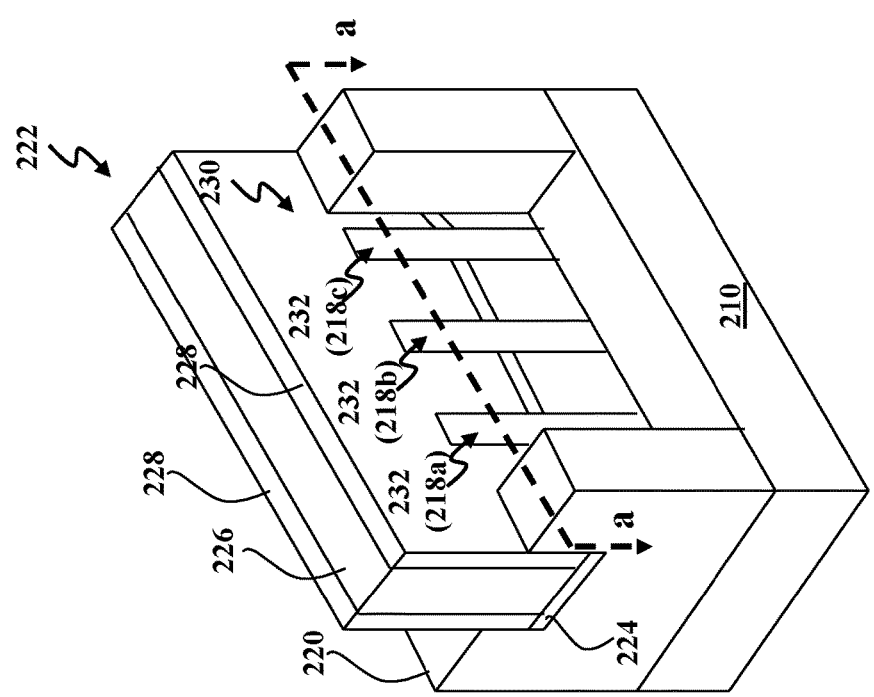

Referring to FIGS. 8A and B, portions of the insulation material 220 are removed thereby defining source and drain (S/D) regions 230. The S/D regions 230 define a channel region 232 therebetween. The channel region 232 includes a region within the fins 218a,b,c of the fin structure 218 overlaid by the gate structure 222. Portions of the insulation material 220 may be removed such that a top surface of the substrate 210 is exposed and/or sidewalls of each fin 218a,b,c, of the fin structure 218 are exposed. Portions of the insulation material 220 are removed such that a first common plane is formed on one side of the gate structure 222 and a second common plane is formed on the other side of the gate structure 222. The first common plane has in common and includes a surface of the insulation material 220, a surface of each of the fins 218a,b,c, a surface of the gate dielectric layer 224, and a surface of one of the gate spacers 228. The second common plane (which is obstructed in FIG. 8 by the gate structure 222) includes similar features as the first common plane on the opposing side of the gate structure 222, includes a surface of the other gate spacer 228. The second common plane is substantially parallel to the first common plane.

Portions of the insulation material 220 may be removed by any suitable process. In the present embodiment, for example, portions of the insulation material 220 are removed by an etching process. The etching process may include a wet etching or dry etching process, or a combination thereof. In one example, a dry etching process may include forming a photoresist layer, patterning the photoresist layer, etching the insulation material 220, and removing the photoresist layer. In furtherance of the example, the dry etching process used to etch the isolation material may include a chemistry including fluorine-containing gas. In furtherance of the example, the chemistry of the dry etch includes CF4, SF6, or NF3.

Figure 9B:
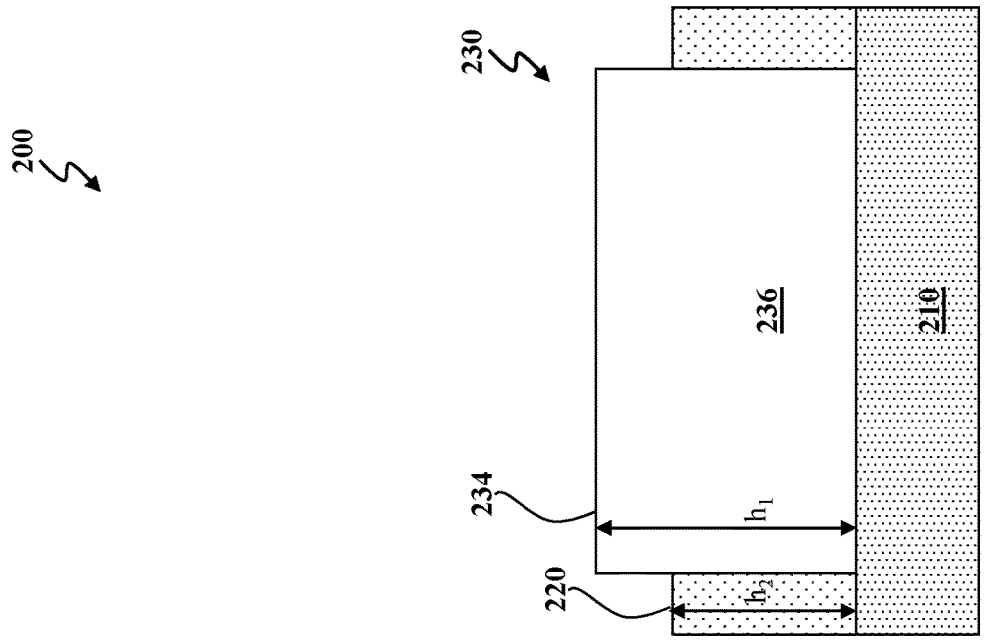
Figure 9A:
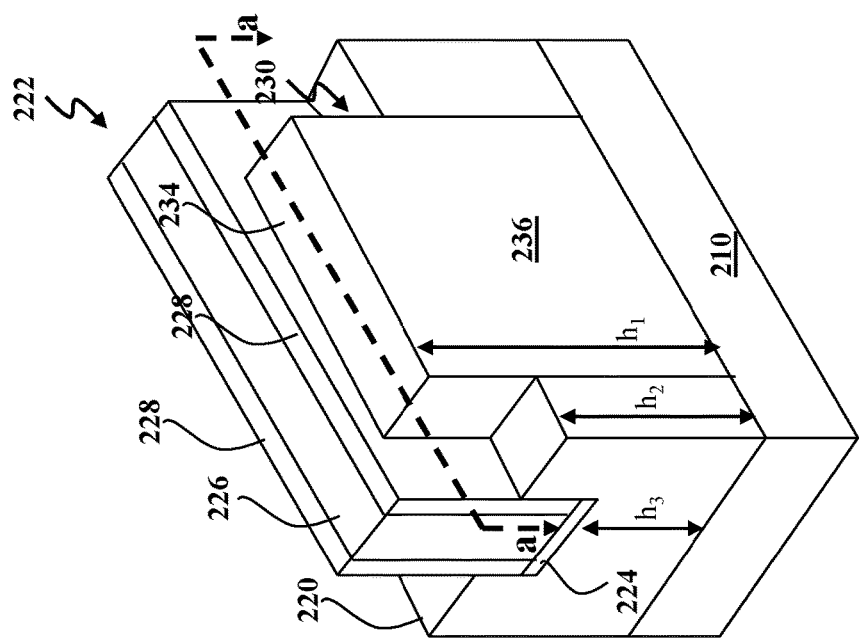

Referring to FIGS. 9A and B, the FinFET device 200 includes source and drain (S/D) features 234 formed in the S/D regions 230. The S/D features 234 may be formed by depositing a semiconductor material 236 over the exposed substrate 210 in the S/D regions 230. The S/D features 234 include a first surface that is adjacent to, in direct contact with, and parallel with a surface of the insulation material 220, fins 218a,b,c, a gate dielectric layer 224, and gate spacers 228, in the first common plane, and a second surface that is adjacent to, in direct contact with, and parallel with a surface of the insulation material 220, fins 218a,b,c, a gate dielectric layer 224, and gate spacers 228, in the second common plane. As illustrated, the S/D features 234 are formed from a material having a continuous and uninterrupted surface area.

The semiconductor material 236 may be deposited by a suitable process, such as an epitaxy or epitaxial (epi) process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fin structure 218 and the exposed substrate 210. In the depicted embodiment, the FinFET device 200 is a PMOS device, and thus, the S/D features 234 are strained and comprise silicon germanium (SiGe), formed by a silicon germanium epitaxial deposition process. Where the FinFET device 200 is a PMOS device, the lattice constant of the S/D features 234 are greater than the lattice constant of the substrate 210 (and the fin structure 218). Alternatively, the FinFET device 200 could be an NMOS device, and thus, the S/D features 234 are strained and could comprise silicon carbide (SiC) or silicon (Si). In some embodiments, the silicon carbide (SiC) or silicon (Si) may comprise one or more dislocations to increase strain of the S/D features 234 on the channel region 232. Where the FinFET device 200 is an NMOS device, the lattice constant of the S/D features 234 are less than the lattice constant of the substrate 210 (and the fin structure 218). The strained S/D features 234 may be doped during its deposition (growth) by adding impurities to the source material of the epitaxy process or subsequent to its deposition growth process by an ion implantation process. For example, a silicon epi layer may be doped with phosphorous (to form a Si:P epi layer). The doped epitaxial layer may have a gradient doping profile. Prior to or after forming the strained S/D features 234, implantation, diffusion, and/or annealing processes may be performed to form heavily doped S/D (HDD) features in the S/D regions 230 of the FinFET device 200, of a p-type if the FinFET device 200 is a PMOS device, or of an n-type if the FinFET device 200 is an NMOS device.

As illustrated in FIGS. 9A and B, the strained S/D features 234 include a continuous rectangular/square-shaped profile/structure having a continuous and uninterrupted surface area. The strained S/D features 234 include a height h1 that is greater than a height h2 of the insulation material 220 adjacent to the strained S/D features 234. The insulation material 220 height h2 is greater than a height h3 of the insulation material 220 upon which the gate structure 222 is formed. The heights of the respective structures being measured from the top of the substrate 210 to the respective portion of each of the respective structures. As illustrated, portions of the strained S/D features 234 are adjacent to and in direct contact with the substrate 210, the insulation material 220, each of the fins 218a,b,c, of the fin structure 218, the gate dielectric layer 224, and the gate spacers 228. Also, portions of the insulation material 220 extend above the gate dielectric layer 224 and portions of the gate structure 222. Additionally, as illustrated, the S/D feature 234 is formed from a continuous material (having a continuous and uninterrupted surface area) extending from the top of the substrate 210 to a height h1 which is greater than a height h2 of the insulation material 220 immediately adjacent to and in direct contact with the S/D feature 234.

A benefit of the method 100 and FinFET device 200 is that the S/D 234 features have a large and continuous and uninterrupted surface area. The larger surface area of the strained S/D features 234 provides increased/higher strain to the channel region 232 of the FinFET device 200, when compared to traditional FinFET devices, thereby improving carrier mobility in a current flow direction of the channel region 232. Further, the method disclosed for achieving the strained structure, having a greater area, described herein is easily implemented into current processing. Different embodiments may have different advantages, and no particular advantage is necessarily required of any embodiment.

The FinFET device 200 may include additional features, which may be formed by subsequent processing. For example, various contacts/vias/lines and multilayer interconnect features (e.g., metal layers and interlayer dielectrics) may be formed over the substrate 210, configured to connect the various features or structures of the FinFET device 200. The additional features may provide electrical interconnection to the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Thus, provided is a semiconductor device. An exemplary semiconductor device includes a substrate including a fin structure disposed over the substrate. The fin structure includes one or more fins. The semiconductor device further includes an insulation material disposed on the substrate. The semiconductor device further includes a gate structure disposed on a portion of the fin structure and on a portion of the insulation material. The gate structure traverses each fin of the fin structure. The semiconductor device further includes a source and drain feature formed from a material having a continuous and uninterrupted surface area. The source and drain feature includes a surface in a plane that is in direct contact with a surface in a parallel plane of the insulation material, each of the one or more fins of the fin structure, and the gate structure.

In some embodiments, the substrate is selected from the group consisting of bulk silicon and silicon-on-insulator (SOI). In various embodiments, the gate structure includes a gate dielectric layer, a gate electrode disposed over the gate dielectric layer, and a gate spacer disposed on a sidewall of the gate electrode. In certain embodiments, the semiconductor device is one of a PMOS FinFET device or a NMOS FinFET device, and wherein the semiconductor device is included in an integrated circuit device. In some embodiments, the insulation material includes a surface at a height (h2) upon which the insulation material is not disposed and a surface at height (h3) upon which the insulation material is disposed. The height h2 is greater than the height h3. In various embodiments, the source and drain feature includes a height (h1) which is greater than a height (h2) of the insulation material immediately adjacent to and in direct contact with the source and drain feature. In an embodiment, the source and drain feature induces a compressive stress in the channel region in a current flow direction. In another embodiment, the source and drain feature induces a tensile stress in the channel region in a current flow direction. In various embodiments, the source and drain feature is in direct contact with the substrate, the insulation material, the gate spacers, and each fin of the fin structure.

Also provided is a alternative embodiment of a semiconductor device. The exemplary semiconductor device includes a substrate and a fin structure including one or more fins disposed over the substrate. The fin structure includes a first surface in a first common plane and a second surface in a second common plane. The first and second common planes are different. The semiconductor device further includes a dielectric layer disposed on a central portion of the fin structure. The semiconductor device further includes a gate electrode disposed on the dielectric layer. The gate electrode traverses the one or more fins and separates source and drain regions of the semiconductor device. The source and drain regions define a channel region, for each of the one or more fins, therebetween. The semiconductor device further includes a first gate spacer formed on a first sidewall of the gate electrode and a second gate spacer formed on a second sidewall of the gate electrode. The semiconductor device further includes strained source and drain features formed directly on the substrate in the source and drain regions. The strained source and drain features are formed from a continuous material.

In some embodiments, the semiconductor device further includes an insulation material disposed on the substrate. The insulation material includes a first surface in the first common plane and a second surface in the second common plane. The strained source and drain features include: a first surface that is in direct contact with and parallel to the first surface of fin structure, the first surface of the insulation material, and the surface of the first gate spacer, in the first common plane, and a second surface that is in direct contact with and parallel to the second surface of the fin structure, the second surface of the insulation material, and the surface of the second gate spacer, in the second common plane In some embodiments, the strained source and drain features include silicon germanium. In various embodiments, the first common plane and the second common plane are substantially parallel. In certain embodiments, the semiconductor substrate and the fin structure include silicon.

Also provided is a method. The method includes providing a substrate and forming a fin structure including one or more fins over the substrate. The method further includes depositing an insulation material over the fin structure and removing a portion of the insulation material such that a portion of each of the one or more fins of the fin structure is exposed. The method further includes forming a gate structure over the exposed portion of each of the one or more fins of the fin structure. The gate structure separates source and a drain regions of the semiconductor device. The method further includes removing the insulation material in the source and drain regions and forming a source and drain features in the source and drain regions. The source and drain features have a continuous and uninterrupted surface area.

In some embodiments, forming the fin structure includes an etching process that uses a hard mask. In certain embodiments, removing a portion of the insulation material such that a portion of each of the one or more fins of the fin structure is exposed includes performing an etching process such that the insulation material in the source and drain regions is not removed. In various embodiments, removing a portion of the insulation material such that a portion of each of the one or more fins of the fin structure is exposed includes: forming a mask layer over the insulation material in the source and drain regions; and performing an etching process such that a portion of the insulation material not covered by the mask layer is removed, thereby exposing a portion of each of the one or more fins of the fin structure. In an embodiment, forming the gate structure includes forming a gate electrode and forming a first and second gate spacer on a first and second sidewall of the gate electrode. In further embodiments, providing the substrate includes providing a substrate including silicon, and forming the source and drain features includes epitaxially (epi) growing a semiconductor material directly on the silicon substrate. In still further embodiments, epitaxially (epi) growing the semiconductor material includes filling the source and drain regions such that a portion of the semiconductor material is in direct contact with the first and second gate spacer. In some embodiments, removing the insulation material in the source and drain regions includes exposing a surface of the substrate, and forming the source and drain features includes epitaxially (epi) growing a semiconductor material on the exposed surface of the substrate, the semiconductor material and the fin structure having different lattice constants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a fin structure including a plurality of fins disposed over a substrate, wherein the plurality of fins are aligned in a first direction, and further wherein each of the plurality of fins extend in a second direction orthogonal to the first direction;
   an insulation material disposed on the substrate between the plurality of fins, wherein the insulation material disposed between the plurality of fins does not extend beyond the plurality of fins in the second direction;
   a gate structure traversing the plurality of fins along the first direction; and
   a source and drain feature having a surface in contact with sidewall surfaces of the plurality of fins, sidewall surfaces of the insulation material disposed between the plurality of fins, and sidewall surfaces of the gate structure, and further wherein the insulation material further includes a portion disposed on the substrate that defines a first end and a second end of the source and drain feature, wherein the source and drain feature extends along the first direction from the first end to the second end.

2. The semiconductor device of claim 1, wherein the source and drain feature has a height greater than a height of the portion defining the first end and the second end.

3. The semiconductor device of claim 1, wherein the source and drain feature includes a bottom surface defined by the substrate, wherein the bottom surface extends from the first end to the second end.

4. The semiconductor device of claim 1, wherein the gate structure includes a gate dielectric layer disposed over the plurality of fins, a gate electrode disposed over the gate dielectric layer, and gate spacers disposed on sidewalls of the gate electrode.

5. The semiconductor device of claim 1, wherein the source and drain feature includes a semiconductor material having a continuous surface area that is uninterrupted by the insulation material.

6. The semiconductor device of claim 1, wherein the portion defining the first end and the second end has a height greater than a height of the insulation material disposed between the plurality of fins.

7. A semiconductor device comprising:
   a plurality of fins extending from a substrate, wherein the plurality of fins are disposed between a source region and a drain region, a channel region being defined in each of the plurality of fins between the source region and the drain region;
   an insulation material disposed on the substrate between the plurality of fins, wherein the insulation material is disposed adjacent to bottom sidewall portions of the plurality of the fins;
   a gate structure wrapping top sidewall portions of the plurality of fins, the gate structure including a gate dielectric layer and a gate electrode layer; and
   a source feature and a drain feature disposed on the substrate respectively in the source region and the drain region, wherein the plurality of fins and the insulation material disposed adjacent to the bottom sidewall portions of the plurality of the fins do not extend into the source feature and the drain feature, and further wherein the insulation material includes a portion that defines a first sidewall and a second sidewall of the source region and the drain region, such that the source feature and the drain feature extend from the first sidewall to the second sidewall.

8. The semiconductor device of claim 7, wherein:
a surface of the source feature is in direct contact with a first surface of each fin of the plurality of fins, a first surface of the insulation material disposed adjacent to the bottom sidewall portions of the plurality of fins, and a first surface of the gate structure; and
a surface of the drain feature is in direct contact with a second surface of each fin of the plurality of fins, a second surface of the insulation material disposed adjacent to the bottom sidewall portions of the plurality of fins, and a second surface of the gate structure, wherein the second surfaces are respectively opposite the first surfaces.

9. The semiconductor device of claim 8, wherein the first surfaces are in a first common plane, and the second surfaces are in a second common plane.

10. The semiconductor device of claim 7, wherein:
a first common plane formed by surfaces of the plurality of fins, the insulation material disposed adjacent to the bottom sidewall portions of the plurality of the fins, and the gate structure wrapping the top sidewall portions of the plurality of fins defines a third sidewall of the source region, the third sidewall extending between the first sidewall and the second sidewall, such that the source feature is confined by the first sidewall, the second sidewall, and the third sidewall; and
a second common plane formed by surfaces of the plurality of fins, the insulation material disposed adjacent to the bottom sidewall portions of the plurality of the fins, and the gate structure wrapping the top sidewall portions of the plurality of fins defines a fourth sidewall of the drain region, the fourth sidewall extending between the first sidewall and the second sidewall, such that the drain feature is confined by the first sidewall, the second sidewall, and the fourth sidewall.

11. The semiconductor device of claim 7, wherein the source feature and the drain feature each have a first height that is greater than a second height of the portion of the insulation material defining the first sidewall and the second sidewall.

12. The semiconductor device of claim 7, wherein the portion of the insulation material defining the first sidewall and the second sidewall includes a first portion and a second portion having the second height and a third portion extending between the first portion and the second portion, the third portion having a third height that is less than the second height.

13. A semiconductor device comprising:
a fin structure having at least three fins disposed over a substrate;
an insulation material disposed over the substrate and configured to isolate the at least three fins, wherein the insulation material includes:
a first portion disposed adjacent to a lower portion of sidewalls of the at least three fins extending along a direction defining a length of the at least three fins, wherein the first portion does not extend beyond the at least three fins along the direction defining the length, and
a second portion disposed adjacent the first portion, such that the second portion bounds the at least three fins, wherein the second portion extends beyond the at least three fins along the direction defining the length of the at least three fins, such that the second portion defines a source region and a drain region;
a gate structure traversing the at least three fins along a direction defining a width of the at least three fins, wherein the gate structure is disposed adjacent to an upper portion of the sidewalls of the at least three fins extending along the direction defining the length, and further wherein the gate structure is disposed over the first portion and the second portion of the insulation material, the gate structure having a gate dielectric layer, a gate electrode layer disposed over the gate dielectric layer, and gate spacers disposed along sidewalls of the gate dielectric layer and the gate electrode layer; and
a source feature and a drain feature respectively disposed in the source region and the drain region, wherein the source feature and the drain feature each include a sidewall in a plane that is in direct contact with sidewalls of the first portion of the insulation material, sidewalls of the gate spacers, and sidewalls of the at least three fins extending along the direction defining the width, and further wherein the source feature and the drain feature are not disposed over the insulation material.

14. The semiconductor device of claim 13, wherein sidewalls of the first portion of the insulation material, sidewalls of the gate spacers, and the upper portion and the lower portion of the sidewalls of the at least three fins are in a substantially parallel plane.

15. The semiconductor device of claim 13, wherein a bottom surface of the source feature, a bottom surface of the drain feature, and a bottom surface of the first portion of the insulation material are defined by the same surface of the substrate.

16. The semiconductor device of claim 13, wherein the source feature and the drain feature have a top surface at a first height that is greater than a second height of a top surface of the second portion of the insulation material.

17. The semiconductor device of claim 16, wherein the gate structure is disposed on a portion of the second portion of the insulation material having a top surface at a third height that is less than the second height.

18. The semiconductor device of claim 17, wherein the first portion of the insulation material has a top surface at the third height.

* * * * *